(12) United States Patent
Peng et al.

(10) Patent No.: US 11,923,300 B2
(45) Date of Patent: Mar. 5, 2024

(54) TWO-DIMENSIONAL (2D) METAL STRUCTURE

(71) Applicant: Taiwan Semiconductor Manufacturing Company, Ltd., Hsinchu (TW)

(72) Inventors: Shih-Wei Peng, Hsinchu (TW); Jiann-Tyng Tzeng, Hsinchu (TW); Ken-Hsien Hsieh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 44 days.

(21) Appl. No.: 17/371,321

(22) Filed: Jul. 9, 2021

(65) Prior Publication Data

US 2023/0008779 A1   Jan. 12, 2023

(51) Int. Cl.
*H01L 23/528* (2006.01)
*H01L 21/033* (2006.01)
*H01L 21/768* (2006.01)
*H01L 23/522* (2006.01)
*H01L 27/085* (2006.01)
*H01L 27/092* (2006.01)

(52) U.S. Cl.
CPC .... *H01L 23/5283* (2013.01); *H01L 21/76816* (2013.01); *H01L 23/5286* (2013.01); *H01L 27/085* (2013.01); *H01L 27/0924* (2013.01); *H01L 21/0337* (2013.01); *H01L 23/5226* (2013.01)

(58) Field of Classification Search
CPC ............. H01L 23/5283; H01L 23/5286; H01L 23/5226; H01L 23/528; H01L 21/76816; H01L 21/0337; H01L 21/76895; H01L 21/31144; H01L 21/823475; H01L 27/085; H01L 27/0924; H01L 27/092; H01L 27/088
See application file for complete search history.

(56) References Cited

U.S. PATENT DOCUMENTS

| | | | |
|---|---|---|---|
| 6,515,374 B1* | 2/2003 | Banisch | H01L 23/5226 257/908 |
| 2004/0251501 A1* | 12/2004 | Catalasan | H01L 23/544 257/E23.179 |

(Continued)

*Primary Examiner* — Shahed Ahmed
*Assistant Examiner* — Vicki B. Booker
(74) *Attorney, Agent, or Firm* — MERCHANT & GOULD P.C.

(57) ABSTRACT

A semiconductor structure includes: a first gate structure and a second gate structure extending in a first direction; a first base level metal interconnect (M0) pattern extending in a second direction perpendicular to the first direction; a second M0 pattern extending in the second direction; a third M0 pattern located between the first and second gate structures and extending in the first direction, two ends of the third M0 pattern connected to the first M0 pattern and the second M0 pattern, respectively; a fourth M0 pattern and a fifth M0 pattern located between the first and second M0 patterns and extending in the second direction. A distance between the fourth M0 pattern and the first M0 pattern in the first direction is equal to a minimum M0 pattern pitch, and a distance between the fourth M0 pattern and the second M0 pattern is equal to the minimum M0 pattern pitch.

20 Claims, 16 Drawing Sheets

(56) References Cited

U.S. PATENT DOCUMENTS

2007/0278681 A1* 12/2007 Yu .................... H01L 23/528
                                                              257/758
2010/0270671 A1* 10/2010 Holesovsky ........ H01L 23/522
                                                              257/734
2014/0264913 A1* 9/2014 Huang ................ H01L 23/528
                                                              257/774

* cited by examiner

TWO-DIMENSIONAL (2D) METAL STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (i.e., the number of interconnected devices per chip area) has generally increased while geometry size (i.e., the smallest component that can be created using a fabrication process) has decreased. However, this mainstream evolution needs to follow the Moore's rule by a huge investment in facility establishment. Therefore, it has been a constant need to develop ICs with lower power consumption, better performance, smaller chip areas, and lower costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
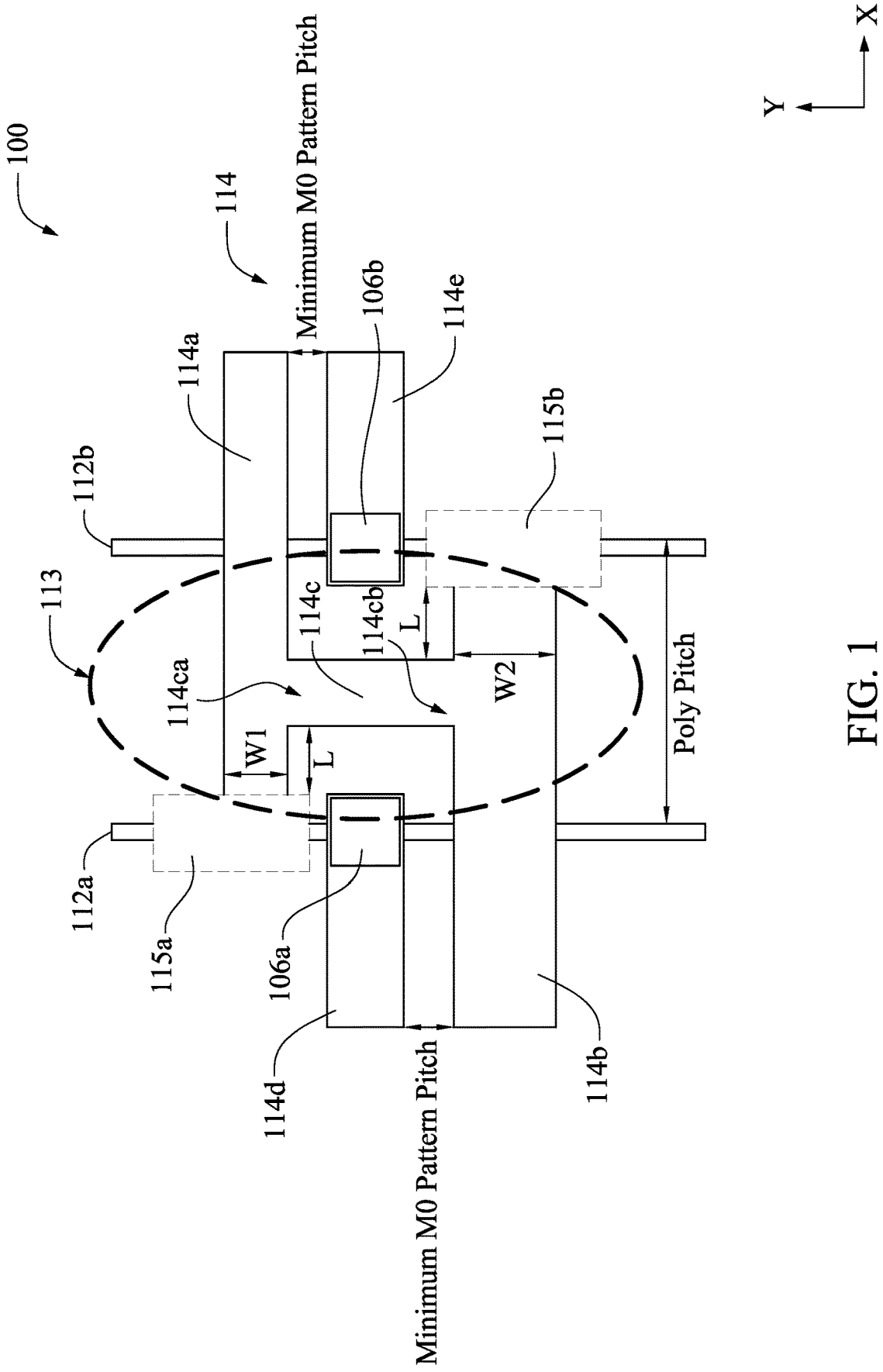
FIG. 1 is a diagram illustrating a top view of a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Double patterning is a technology developed for lithography to enhance the feature density. Typically, for forming features of integrated circuits on wafers, the lithography technology is used, which involves applying a photo resist, and defining patterns on the photo resist. The patterns in the patterned photo resist are first defined in a lithography mask, which may be a glass with transparent patterns and opaque portions formed thereon. The transparent patterns of the lithography mask allow the light for exposing the photo resist to pass, and the opaque patterns blocks the light. The patterns in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The closely located features are separated to two masks of a same double-patterning mask set, with both masks used to expose the same photo resist. In each of the masks, the distances between features are increased over the distances between features in the otherwise a single mask, and hence the optical proximity effect is reduced.

Extreme ultraviolet (EUV) lithography is being used more widely to achieve smaller metal pitches. Compared to current light sources, EUV has shorter wavelength which can provide higher resolution and better CDU (critical dimension uniformity). In addition to the patterning improvements, in some embodiments the use of EUV lithography reduces the number of photomasks from multiple patterning to double or even single layer patterning, thereby reducing the processing time and improving process yield.

Methods for simplifying chip-level routing and manufacture of semiconductor IC layout designs generated using an electronic design automation (EDA) tool involve forming a regular metal pattern, e.g., a base level metal interconnect pattern (metal zero (M0) layer), and then selectively cutting (removing) portions of the metal pattern according to the applicable design rules. Metal cuts on the base level metal interconnect pattern (CM0) at the cell boundaries of a standard cell layout (boundary metal cuts) are used to separate/disconnect adjacent standard cells such that each of the separated cells are able to perform independently designated function(s).

The conductive layers from which the gate electrodes and source/drain conductors are patterned comprise one or more conductive materials including aluminum, copper, cobalt, tungsten, titanium, nickel, gold, platinum, graphene, silicides, salicides, and mixtures and alloys thereof, applied to a substrate singly, in series, and/or in combination. The conductive layer deposition processes include one or more of chemical vapor deposition (CVD) processes, atomic layer deposition (ALD) processes, plasma vapor deposition (PVD) process, electroplating processes, electroless plating processes, and any other suitable application process(es) or combinations thereof. In some embodiments, the conductive layers are formed over a nitrogen-free anti-reflective coating (NFARC) layer for improved patterning control.

A standard cell structure includes one or more standard cells from a standard cell library, according to some embodiments. The standard cell is selected from a group comprising AND, OR, XOR, XNOR, NAND, inverter, and other suitable logic devices. In some embodiments, metal cuts (e.g., boundary metal cuts and internal metal cuts) are located on the base level metal interconnect pattern by using a modified metal-cut mask layer. As used herein, the term "boundary metal cuts" refers to metal cuts placed along cell boundaries of standard cells and term "internal metal cuts" refers to metal cuts other than boundary metal cuts performed on the standard cells. Terms "boundary metal cuts" and "internal metal cuts" are simply relative terms and do not indicate any difference in the patterning, developing, and/or etching of the designated metal cuts.

As metal pitches are getting smaller and smaller, lower level metal patterns such as M0 layer metal patterns and first metal (M1) layer metal patterns are typically one-dimensional (1D), extending linearly in a predefined direction (e.g., an X direction). As such, more metal patterns can be placed in a certain chip area. In one non-limiting example, M0 layer metal patterns extend in the X direction; M1 layer metal patterns extend in a Y direction perpendicular to the X direction. The M0 layer metal patterns and the M1 layer metal patterns are placed on a grid made up of intersecting straight lines in the X direction and in the Y direction, respectively, subject to metal pattern pitch limitations. However, under this grid-based connection, the diagonal connection typically takes a detour with another metal pattern above and two vertical interconnect accesses (vias). As a result, the detour increases resistance and capacitance, which may in turn impact the performance and power consumption of the chip.

In accordance with some embodiments, a semiconductor structure that includes an I-shaped pattern in one metal layer is provided. The I-shaped pattern is two-dimensional (2D) rather than one-dimensional (1D). The I-shaped pattern is fabricated using double-patterning litho-spacer-litho-etch (LSLE) process. The 2D I-shaped pattern can improve routing utilization by avoiding detour with another metal pattern in another metal layer and two vias. Accordingly, increased resistance and capacitance due to the detour can be avoided, which may in turn improve the performance and reduce power consumption of the chip. On the other hand, the 2D I-shaped pattern can enlarge sizes of vias landing thereon, therefore decreasing resistance for various applications.

Figure 2A:
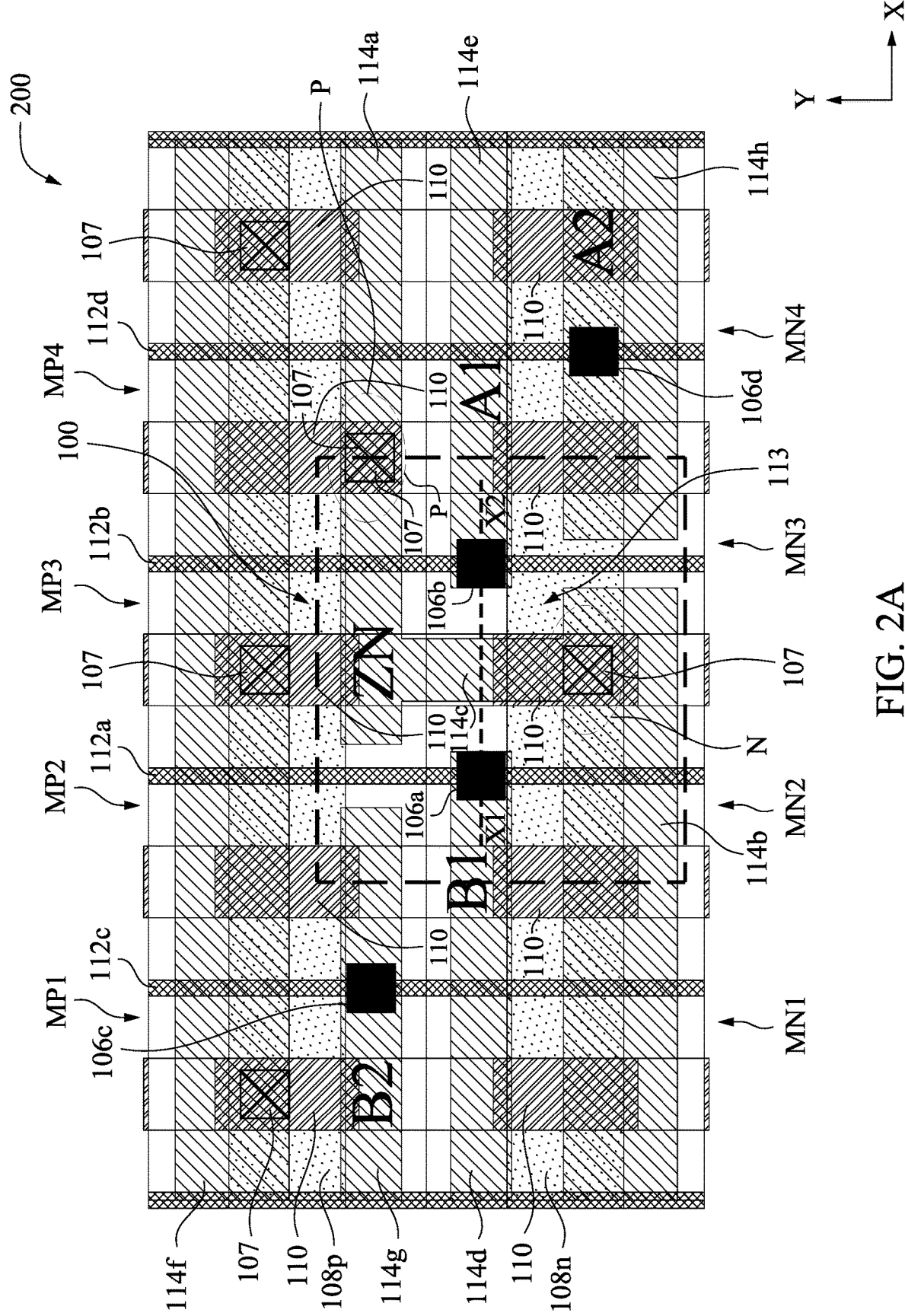
FIG. 2A is a diagram illustrating a layout that includes the semiconductor structure 100 of FIG. 1 in accordance with some embodiments.
Figure 2B:
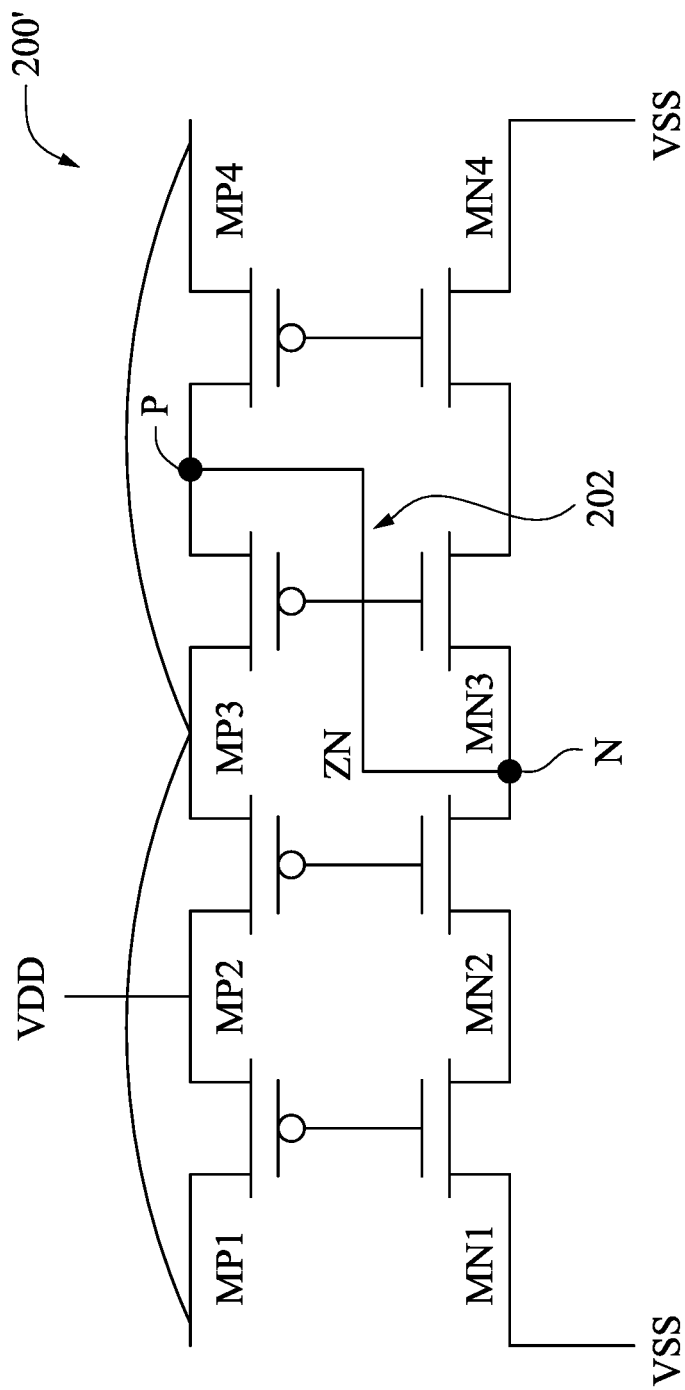
FIG. 2B is a diagram illustrating a circuit corresponding to the layout of FIG. 2A in accordance with some embodiments.
Figure 2C:
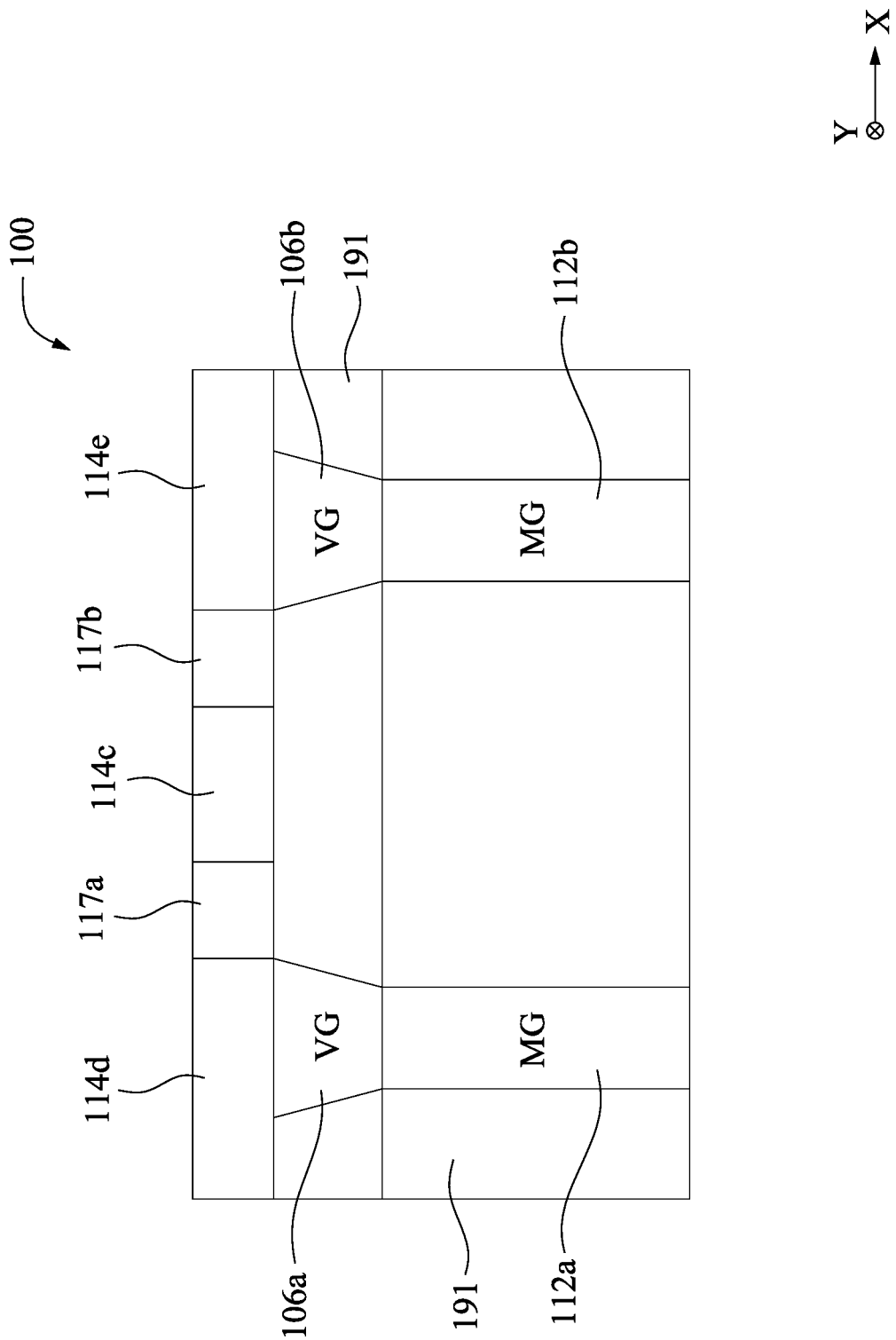
FIG. 2C is a cross-sectional diagram, taken at line X1-X2 of FIG. 2A, of the semiconductor structure in the layout of FIG. 2A in accordance with some embodiments.

FIG. 1 is a diagram illustrating a top view of a semiconductor structure 100 in accordance with some embodiments. FIG. 2A is a diagram illustrating a layout 200 that includes the semiconductor structure 100 of FIG. 1 in accordance with some embodiments. FIG. 2B is a diagram illustrating a circuit 200' corresponding to the layout 200 of FIG. 2A in accordance with some embodiments. FIG. 2C is a cross-sectional diagram, taken at line X1-X2 of FIG. 2A, of the semiconductor structure 100 in the layout 200 of FIG. 2A in accordance with some embodiments. In general, the semiconductor structure 100 includes an I-shaped M0 pattern 114 in the M0 layer mentioned above. In other words, the I-shaped M0 pattern 114 is two-dimensional (2D) rather than 1D. The fabrication of metal patterns of the semiconductor structure 100 will be described in detail below with reference to FIGS. 4-111B.

As shown in FIG. 1, the semiconductor structure 100 includes, among other things, gate structures 112a and 112b (collectively 112), M0 patterns 114a-114e (collectively 114), gate vias 106a and 106b (collectively). The gate structures 112 extend in a predefined direction Y, with a poly pitch (also known as contacted poly pitch (CPP)) subject to process limitations for different technology nodes (e.g., N10, N7, N5, etc.). The M0 patterns 114 have a predefined direction X which is perpendicular to the Y direction. Typically, the M0 patterns 114 extend in the X direction, with a metal pitch subject to process limitations for different technology nodes (e.g., N10, N7, N5, etc.). As mentioned above, the M0 patterns 114 typically all extend in the X direction (i.e., 1D arrangement) with the M0 metal pitch, to achieve efficient utilization of chip area. However, as shown in the example in FIG. 1, the M0 patterns 114a, 114b, 114d, and 114e extend in the X direction (i.e., the predefined direction), the M0 pattern 114c extends in the Y direction. The M0 patterns 114d and 114e are aligned in the X direction. A first end 114ca and a second end 114cb of the M0 pattern 114c are connected to the M0 pattern 114a and the M0 pattern 114b, respectively. As such, an I-shaped M0 pattern 113, including the M0 patterns 114a, 114c, and 114b, is formed. The M0 patterns 114d and 114e, which are between the M0 patterns 114a and 114b, are automatically cut off by the M0 pattern 114c, meaning that no metal cut mask is needed to separate the M0 patterns 114d and 114e. The M0 patterns 114a, 114b, 114c, 114d, and 114d are fabricated by LSLE process, which will be describe in detail with reference to FIGS. 4-111B. The M0 patterns 114a, 114b, 114c, and 114d therefore have a dense arrangement with efficient utilization of chip area. In other words, the distance between the M0 patterns 114d and 114b is the minimum M0 pattern pitch; the distance between the M0 patterns 114d and 114a is also the minimum M0 pattern pitch. In the meantime, the M0 pattern 114c provides a Y-direction connection between the M0 patterns 114a and 114b, which can be utilized in various embodiments to avoid the detour mentioned above.

The M0 patterns 114d and 114e are connected to the gate structure 112a and 112b through gate vias 106a and 106b, respectively. Metal cuts (in the form of a separate mask)

115a and 115b may be used as needed to cut the M0 metal patterns 114a and 114b, respectively.

In the non-limiting example in FIG. 1, the M0 pattern 114a has a width of W1, whereas the M0 pattern 114b has a width of W2. In another embodiment not shown, the M0 pattern 114a and the M0 pattern 114b both have a width of W1. The distance in the X direction between the M0 pattern 114c and the M0 pattern 114d is L; the distance in the X direction between the M0 pattern 114c and the M0 pattern 114e is L as well. It should be noted that the non-limiting example in FIG. 1 does not reflect the corner rounding effect. Details of the impact of the corner rounding effect will be described below with reference to FIG. 3.

As mentioned above, the layout 200 of FIG. 2A includes the semiconductor structure 100 of FIG. 1. The layout 200 of FIG. 2A corresponds to the circuit 200' of FIG. 2B. As shown in FIG. 2B, the circuit 200' is an AND-OR-Inverter (AOI) logic gate. The circuit 200' includes eight transistors: four p-type transistors MP1, MP2, MP3, and MP4; and four n-type transistors MN1, MN2, MN3, and MN4. MP1 and MP2 are connected in parallel, MP3 and MP4 are connected in parallel, and the two pairs are further connected in series between VDD and node P. On the other hand, NM1 and NM2, which are connected in series, are connected in parallel with MN3 and MN4, which are also connected in series, between VSS and node N. Gates of MP1 and MN1 are connected together as a first input terminal; gates of MP2 and MN2 are connected together as a second input terminal; gates of MP3 and MN3 are connected together as a third input terminal; gates of MP4 and MN4 are connected together as a fourth input terminal. Nodes P and N are connected together, through a path 202, as the output terminal (ZN).

Referring to FIG. 2A, the layout 200 includes a p-type active region 108p and an n-type active region 108n (collectively active regions 108), metal-like defined (MD) patterns 110, gate structures 112a, 112b, 112c, and 112d (collectively gate structures 112), M0 patterns 114a, 114b, 114c, 114d, 114e, 114f, 114g, and 114h (collectively M0 patterns 114), gate vias 106a, 106b, 106c, and 106d (collectively gate vias 106), source/drain (S/D) vias 107. The embodiment of the layout 200 depicted in FIG. 2A is a non-limiting example including representations of the various elements simplified for the purpose of illustration. In various embodiments, the I-shaped M0 pattern 113 as shown in FIG. 1, including the M0 patterns 114a, 114c, and 114b, connects the node P and the node N as the output terminal (ZN). Specifically, the M0 pattern 114c of the I-shaped M0 pattern 113 extends in the Y direction (perpendicular to the predefined direction X as mentioned above), therefore forming the path 202 of FIG. 2B between the p-type active region 108p and the n-type active region 108n. As such, the 2D I-shaped M0 pattern 113 can improve routing utilization by avoiding the detour with another metal pattern in the first metal (M1) layer and two vias as mentioned above. Accordingly, increased resistance and capacitance due to the detour can be avoided, which may in turn improve the performance and reduce power consumption of the chip. On the other hand, the M0 pattern 114c of the I-shaped M0 pattern 113 can enlarge sizes of vias landing thereon, therefore decreasing resistance for various applications such as high-performance computing or the like.

An active region, e.g., the active regions 108 depicted in FIG. 2A, is a region in an IC layout diagram included in a manufacturing process as part of defining an active area, also referred to as an oxide diffusion or definition (OD) in some embodiments, in a semiconductor substrate. An active area is a continuous section of the semiconductor substrate having either n-type or p-type doping that includes various semiconductor structures, including one or more fins of a FinFET in some embodiments. In various embodiments, an active area is located within a well, i.e., either an n-well or a p-well, within the semiconductor substrate and/or is electrically isolated from other elements in the semiconductor substrate by one or more isolation structures, e.g., one or more shallow trench isolation (STI) structures.

A fin is a raised, elongated portion of an active area extending in a first direction including one or more of an elementary semiconductor, e.g., silicon (Si) or germanium (Ge), a compound semiconductor, e.g., silicon germanium (SiGe), silicon carbide (SiC), gallium arsenide (GaAs), gallium phosphide (GaP), indium phosphide (InP), indium arsenide (InAs), or indium antimonide (ISb), or an alloy semiconductor, e.g., GaAsP, AlinAs, AlGaAs, GainAs, GaInP, or GaInAsP, or the like. It should be noted that the semiconductor structures mentioned above may also be structures other than fins, for example the active area of a gate-all-around (GAA) FET (nano-wire or nano-sheet).

In some embodiments, an active area includes one or more source/drain (S/D) structures corresponding to one or more S/D regions within the active region used to define the active area. An S/D structure is a semiconductor structure within an active area, adjacent to or including portions of the one or more fins, and configured to have a doping type opposite to that of other portions of the active area. In some embodiments, an S/D structure is configured to have lower resistivity than other portions of the active area, e.g., by including one or more portions having doping concentrations greater than one or more doping concentrations otherwise present throughout the active area. In various embodiments, S/D structures include epitaxial regions of a semiconductor material, e.g., Si, SiGe, and/or SiC.

An MD pattern, e.g., the MD patterns 110 depicted in FIG. 2A, is a conductive segment in and/or on a semiconductor substrate. In some embodiments, an MD pattern includes a portion of at least one metal layer, e.g., a contact layer, overlying and contacting the substrate and having a thickness sufficiently small to enable formation of an insulation layer between the MD pattern and an overlying metal layer, e.g., the M0 layer. In various embodiments, an MD pattern includes one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD pattern includes a section of the semiconductor substrate and/or an epitaxial layer having a doping level, e.g., based on an implantation process, sufficient to cause the segment to have the low resistance level. In various embodiments, a doped MD pattern includes one or more of silicon (Si), silicon-germanium (SiGe), silicon-carbide (SiC), boron (B), phosphorous (P), arsenic (As), gallium (Ga), a metal as discussed above, or another material suitable for providing the low resistance level. In some embodiments, an MD pattern includes a dopant having a doping concentration of about $1*10^{16}$ per cubic centimeter (cm−3) or greater.

In various embodiments, one or more MD patterns overlaps one or more active regions, and the corresponding one or more MD patterns includes at least a portion within the corresponding one or more active areas. In various embodiments, one or more MD patterns abuts or includes some or all of one or more S/D structures in the corresponding one or more active areas.

A gate structure ("poly"), e.g., one of gate structures 112 depicted in FIG. 2A, is a structure overlying the semiconductor substrate. A gate structure is a volume including one or more conductive segments including one or more conductive materials, e.g., polysilicon, one or more metals, and/or one or more other suitable materials, substantially surrounded by one or more insulating materials, e.g., silicon dioxide and/or one or more other suitable materials, the one or more conductive segments thereby being configured to control a voltage provided to underlying and adjacent dielectric layers. In various embodiments, a dielectric layer includes one or more of silicon dioxide and/or a high-k dielectric material, e.g., a dielectric material having a k value higher than 3.8 or 7.0. In some embodiments, a high-k dielectric material includes aluminum oxide, hafnium oxide, lanthanum oxide, or another suitable material.

A conductive pattern, e.g., one of the M0 patterns 114 depicted in FIG. 2A, is a segment of a conductive layer overlying other features, e.g., each of the features discussed above with respect to active regions 108, MD patterns 110, and gate structures 112.

In various embodiments, M0 patterns 114 may include a first subset corresponding to a first mask set and a second subset corresponding to a second mask set different from the first mask set, which will be described in detail below with reference to FIG. 5. Each of the first and second mask sets defines a subset of IC features having dimensions based on a standard feature size, and the subsets of features are arranged in a complementary manner to form combined features having dimensions smaller than those of the features formed by a single one of the mask sets. In various embodiments, a given mask set is referred to as a color group (also known as a line group or a mask pattern group, those terms are used interchangeably throughout the disclosure) based on using multiple colors in an IC layout diagram to distinguish between multiple mask sets.

A via, e.g., one of gate vias 106 or one of S/D vias 107 depicted in FIG. 2A, is a structure configured to provide a low resistance electrical connection between conductive segments/patterns in two or more levels and/or layers. Via structures include one or more of copper (Cu), silver (Ag), tungsten (W), titanium (Ti), nickel (Ni), tin (Sn), aluminum (Al) or another metal or material suitable for providing low resistance electrical connections between IC structure layers.

As mentioned above, the layout 200 includes the semiconductor structure 100 in FIG. 1. The I-shaped M0 pattern 113 connects the node P and the node N as the output terminal (ZN). Specifically, the M0 pattern 114c of the I-shaped M0 pattern 113 extends in the Y direction, therefore forming the path 202 of FIG. 2B between the p-type active region 108p and the n-type active region 108n. The M0 patterns 114d and 114e, which are between the M0 patterns 114a and 114b in the Y direction, are automatically cut off, meaning that no metal cut mask is needed to separate the M0 patterns 114d and 114e. In summary, the M0 patterns 114a, 114b, 114c, 114d, and 114d therefore have a dense arrangement with efficient utilization of chip area. In the meantime, the M0 pattern 114c provides a Y-direction connection between the M0 patterns 114a and 114b, which can be utilized in various embodiments to avoid the detour mentioned above.

Referring to FIG. 2C, as shown in the non-limiting example of FIG. 2C, the M0 patterns 114d and 114e are automatically cut off by separation structures 117a and 117b (collectively 117). The separation structures 117a and 117b are fabricated by LSLE process, which will be described in detail below with reference to FIGS. 4-11B. The Y-direction M0 pattern 114c is located between the separation structures 117a and 117b. The M0 patterns 114d and 114e are connected to gate structures 112a and 112b through gate vias 106a and 106b, respectively. The gate structures 112a and 112b, as well as the gate vias 106a and 106b are located in one or more isolation structures, e.g., one or more shallow trench isolation (STI) structures. In one non-limiting example, the width (in the X direction) of the separation structures 117a and 117b ranges from 6 nm to 10 nm. In one non-limiting example, the width (in the X direction) of the M0 pattern 114c plus the overall width (in the X direction) of the separation structures 117a and 117b is approximately equal to the poly pitch.

Figure 3:
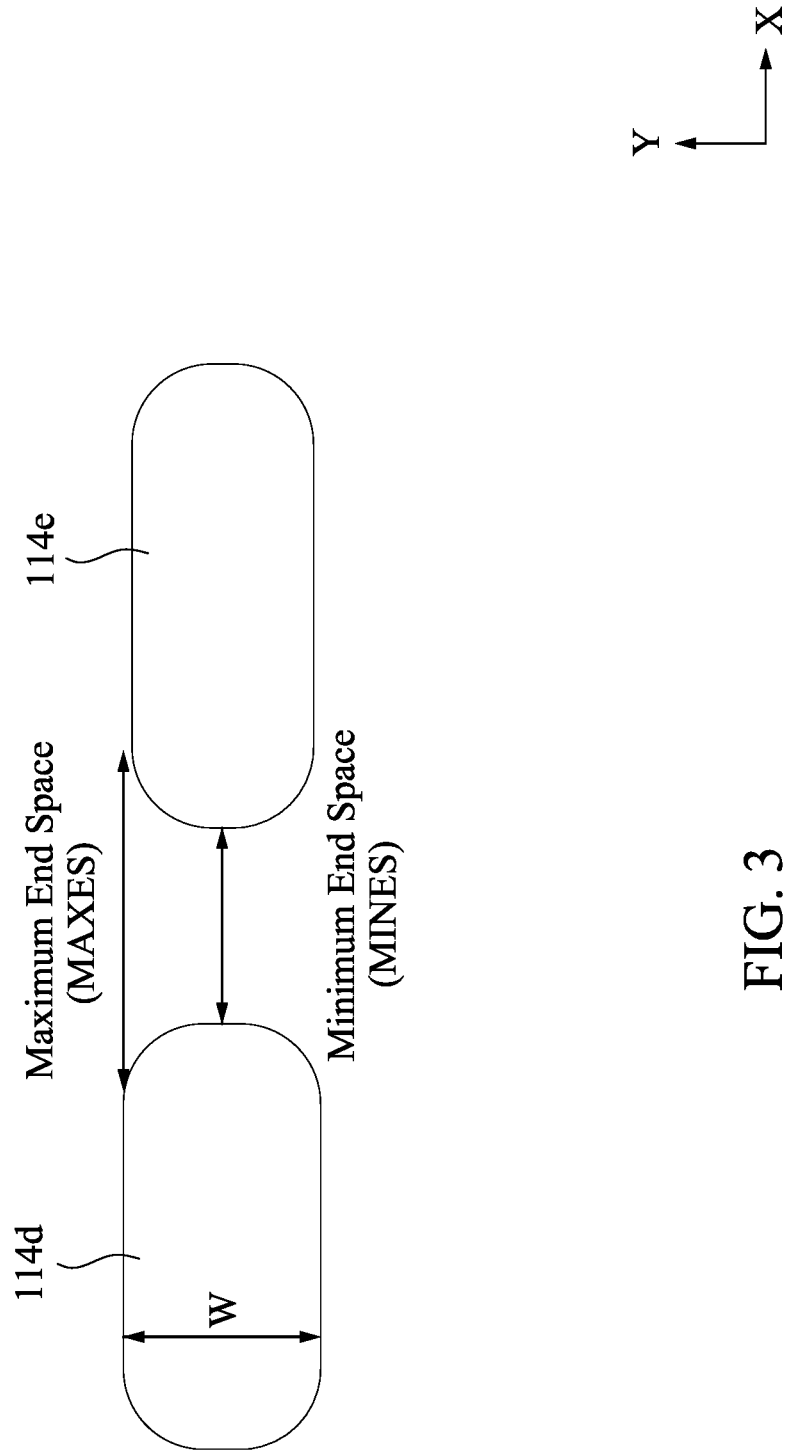
FIG. 3 is a diagram illustrating a top view of the M0 patterns of FIGS. 1 and 2A in accordance with some embodiments.

FIG. 3 is a diagram illustrating a top view of the M0 patterns 114d and 114e of FIGS. 1 and 2A in accordance with some embodiments. As mentioned above, the non-limiting example in FIG. 1 does not reflect the corner rounding effect. As shown in the non-limiting example in FIG. 3, the M0 patterns 114d and 114e both have corners with radiused shapes (i.e., radiused corners) due to etch process during fabrication, which will be described in detail below with reference to FIGS. 4-11B. In one embodiment, the M0 patterns 114d and 114e both have round corners with round shapes (i.e., round corners). Because the M0 patterns 114d and 114e are cut off automatically by the LSLE process as mentioned above, the end space between the M0 patterns 114d and 114e, which is the distance therebetween in the X direction, varies in the Y direction (referred to as "the corner rounding effect"). Specifically, the end space is a minimum end space (MINES) in the middle, whereas the end space is a maximum end space (MAXES). In one embodiment, (MAXES-MINES)>0.5*W, where W is the width of the M0 patterns 114d and 114e.

Referring back to FIG. 1, the distance L in the X direction depends on the corner rounding effect as mentioned above. In one non-limiting example corresponding to an 193 nm immersion (193i) lithographic system, the rounding radius ranges from 30 nm to 40 nm. In another non-limiting example corresponding to an extreme ultraviolet (EUV) lithographic system, the rounding radius ranges from 10 nm to 15 nm. In one non-limiting example, when W1 is the minimum critical dimension of the M0 pattern 114 (i.e., about a quarter of the lithographic pitch), L is larger than half of W1. In another non-limiting example, when W2 is a larger critical dimension than W1, L is smaller than two times of W2.

Figure 4:
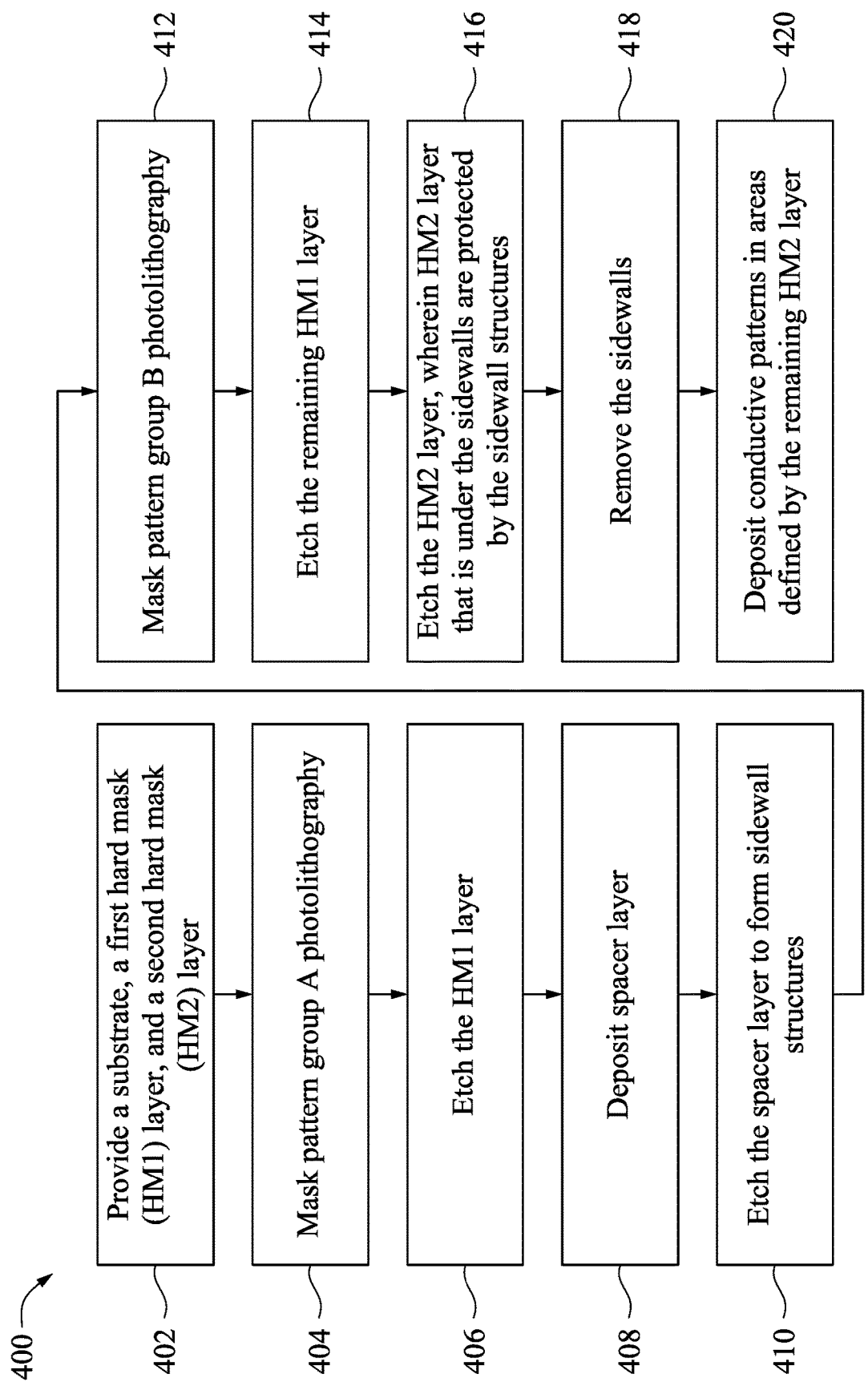
FIG. 4 is a flowchart diagram illustrating a method for fabricating I-shaped (conductive) patterns using LSLE process in accordance with some embodiments.

FIG. 4 is a flowchart diagram illustrating a method 400 for fabricating I-shaped (conductive) patterns using LSLE process in accordance with some embodiments. FIG. 5 is a diagram illustrating two mask pattern groups 502 and 504 used in the method 400 of FIG. 4 in accordance with some embodiments. FIGS. 6A, 7A, 8A, 9A, 10A, and 11A are diagrams illustrating top views of the LSLE manufacturing sequence corresponding to the method 400 of FIG. 4 in accordance with some embodiments. FIGS. 6B, 7B, 8B, 9B, 10B, and 11B are diagrams illustrating corresponding cross-sectional views, taken at line X1-X2, of the LSLE manufacturing sequence corresponding to the method 400 of FIG. 4 in accordance with some embodiments. The method 400 can be used to fabricate I-shaped (conductive) patterns like the M0 patterns 114a, 114b, 114c, 114d, and 114e of FIG. 1.

Figure 5:
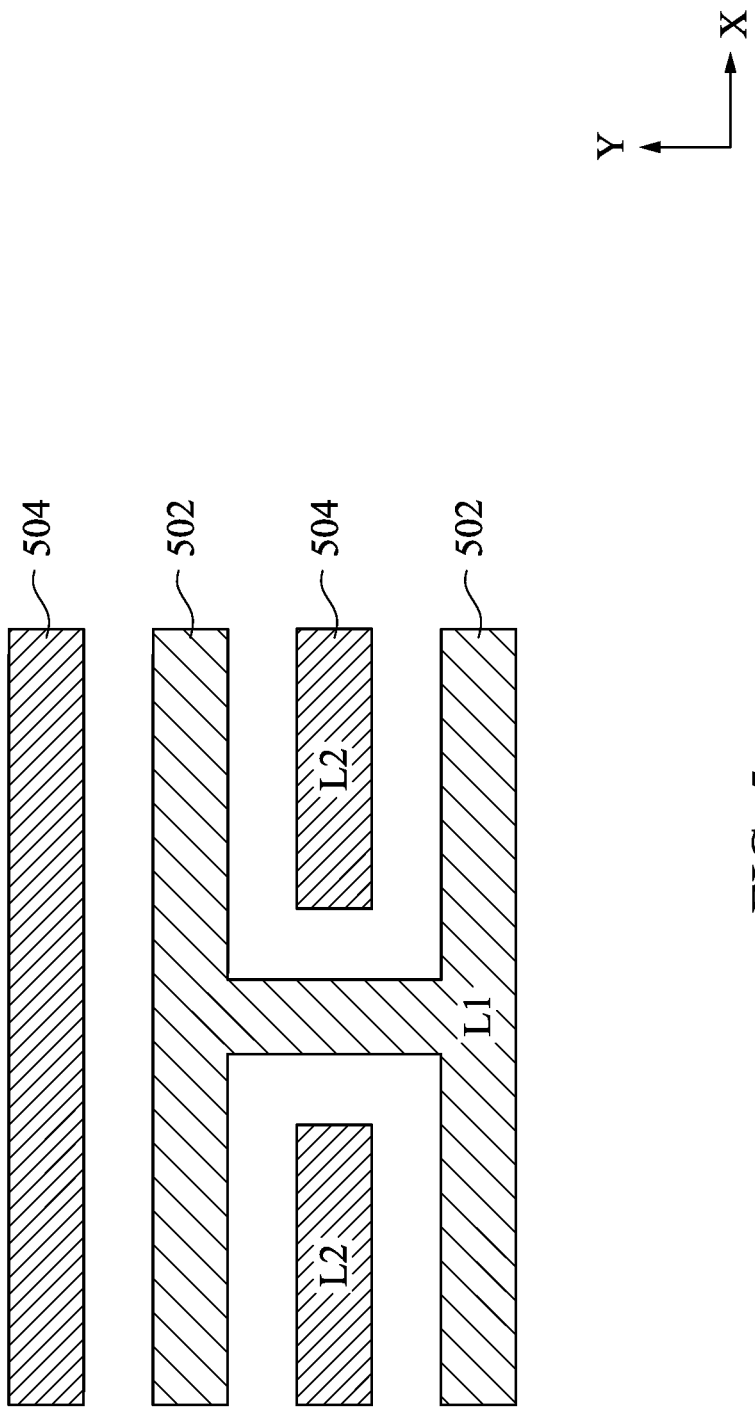
FIG. 5 is a diagram illustrating two mask pattern groups used in the method of FIG. 4 in accordance with some embodiments.

Referring to FIG. 5, the mask pattern group A (also called "L1") 502 corresponds to the I-shaped M0 pattern 113 of FIG. 1, whereas the mask pattern group B (also called "L2") 504 corresponds to the M0 patterns 114d and 114e of FIG. 1. In other words, the A and B patterns correspond to different mask sets, or color groups, and they are used for forming M0 patterns 114 of FIG. 1 corresponding to the A and B patterns and having a minimum spacing, e.g., satisfying a minimum spacing rule subject to metal pitch limitations.

Referring to FIG. 4, the method 400 starts at step 402. At step 402, a substrate, a first hard mask (HM1) layer, and a second hard mask (HM2) layer are provided. In the example shown in FIGS. 6A and 6B, the HM2 layer 604 is above the substrate 602, whereas the HM1 layer 606 is above the HM2 layer 604. It should be noted that the substrate 602 can represent not only substrates like silicon substrates or silicon-on-insulator (SOI) substrates but also any semiconductor structure under the I-shaped conductive patterns. In other words, the method 400 can be used for fabricating the I-shaped conductive patterns on any semiconductor structure. The HM2 layer 604 can protect its underlying layer, namely the substrate 602; the HM1 layer 606 can protect its underlying layer, namely the HM2 layer 604. In one embodiment, the HM2 layer 604 may act as a hard mask for patterning its underlying layer. In another embodiment, the HM2 layer 604 may act as a stop layer during a subsequent chemical-mechanical polish (CMP) and/or etching process. In yet another embodiment, the HM2 layer 604 may act as a protector to protect its underlying layer from being oxidized. The HM1 layer 606 functions in a similar manner. The HM1 layer 606 and the HM2 layer 604 may be formed using suitable processes such as chemical vapor deposition (CVD) and/or the like.

Figure 6A:
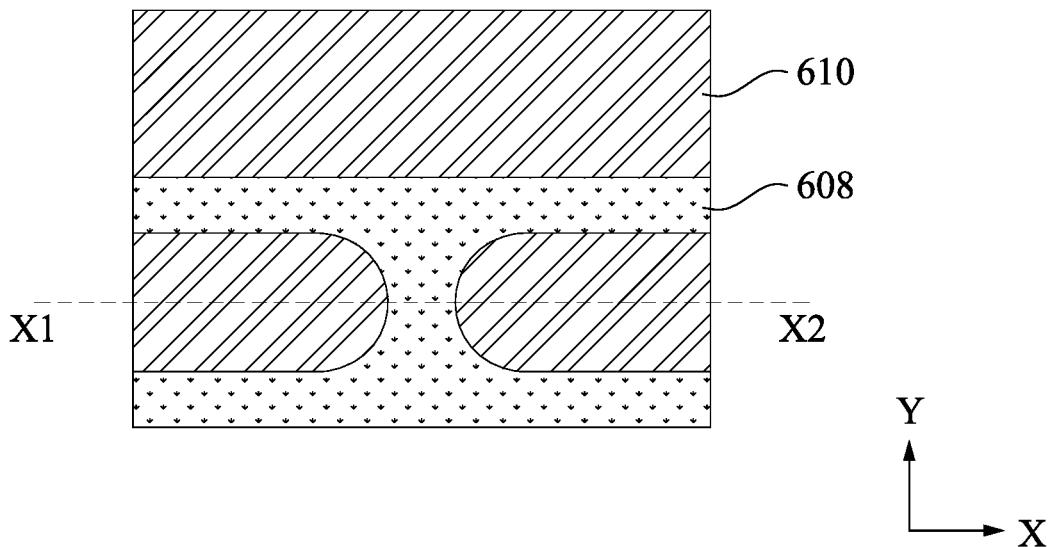
FIGS. 6A, 7A, 8A, 9A, 10A, and 11A are diagrams illustrating top views of the litho-spacer-litho-etch (LSLE) manufacturing sequence corresponding to the method of FIG. 4 in accordance with some embodiments.
Figure 6B:
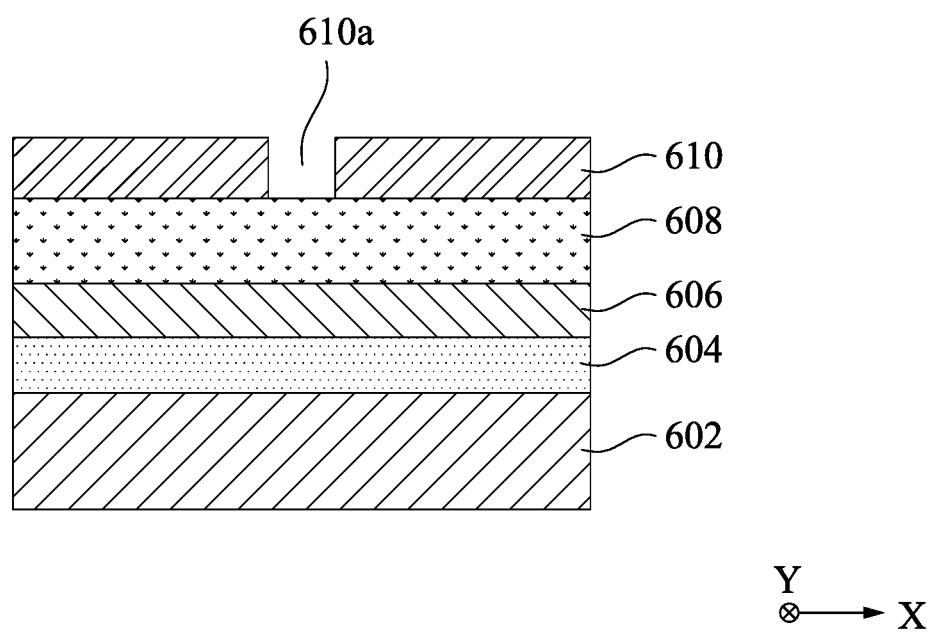
FIGS. 6B, 7B, 8B, 9B, 10B, and 11B are diagrams illustrating corresponding cross-sectional views, taken at line X1-X2, of the LSLE manufacturing sequence corresponding to the method of FIG. 4 in accordance with some embodiments.

At step 404, a photolithography ("litho") is conducted using the mask pattern group A 502 of FIG. 5. Specifically, as shown in FIGS. 6A and 6B, a bottom layer (also referred to as a sacrifice layer or a temporary layer) 608 is applied on the HM1 layer 606, and a photoresist layer 610 is applied on the bottom layer 608. The bottom layer 608 is used in some embodiments to improve adhesion between the photoresist layer 610 and the underlying layer (the HM1 layer 606 in this example), to provide a uniform separation between the top surface of the underlying layer and the photolithography source (i.e., extreme ultraviolet (EUV) light). After the photolithography at step 404, an opening 610a in the photoresist layer 610 is patterned, as shown in FIGS. 6A and 6B. As a result, the portion of the bottom layer 608 corresponding to the opening 610a is exposed. This portion is etched afterwards at step 406.

Figure 7A:
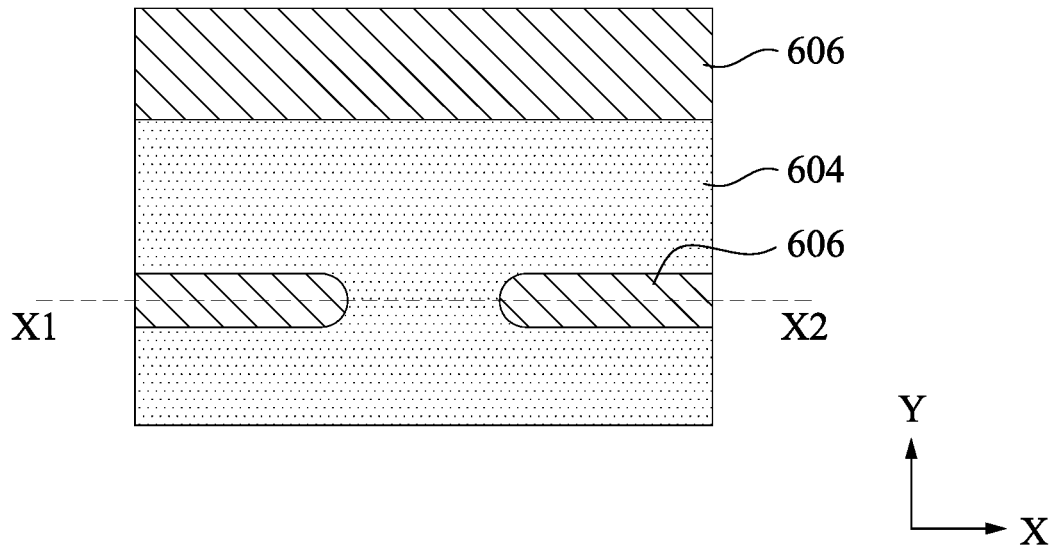
Figure 7B:
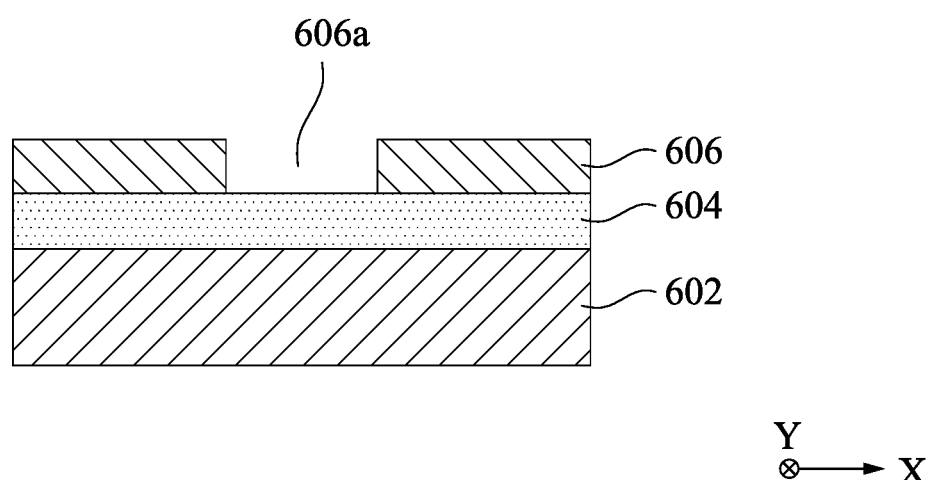

At step 406, the HM1 layer 606 is etched. As shown in FIGS. 6A and 6B, the portion of the bottom layer 608 and the portion of the HM1 layer 606 exposed through the opening 610a are removed in the etching process. After the remaining photoresist layer 610 and the remaining bottom layer 608 are removed, the portion of the HM2 layer 604 corresponding to the mask pattern group A 502 are exposed, as shown in FIGS. 7A and 7B. An opening 606a in the M1 layer 606 is formed, as shown in FIGS. 7A and 7B. The critical dimensions are enlarged during the etching process. In other words, the opening 606a is larger than the shape of the mask pattern group A 502.

Figure 8A:
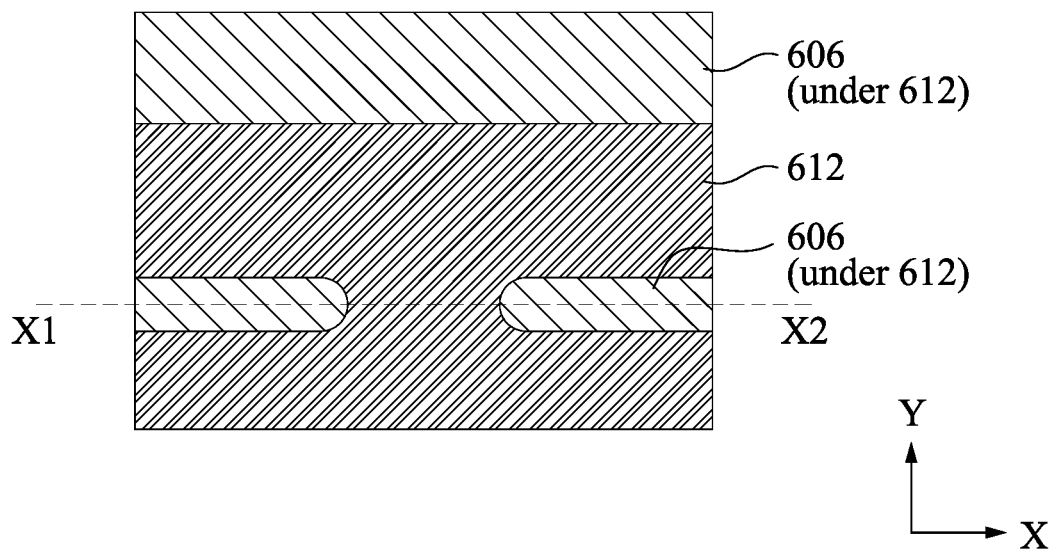
Figure 8B:
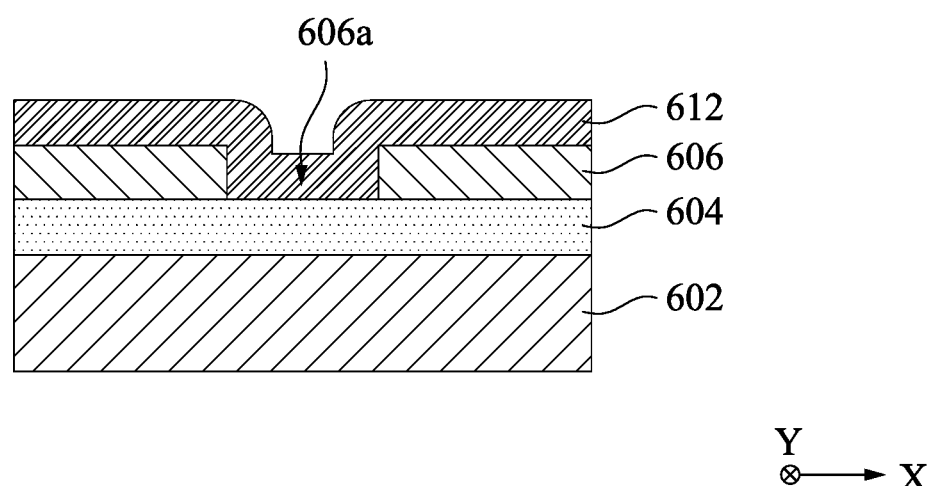

Then at step 408, a spacer layer 612 is deposited on the whole area. As shown in FIGS. 8A and 8B, after step 408, the spacer layer 612 is either on the remaining HM1 layer 606 or on the sidewalls and bottoms of the opening 606a in the HM1 layer 606. The spacer layer is a layer of dielectric material such as silicon nitride, silicon oxy-nitride, and so forth.

Figure 9A:
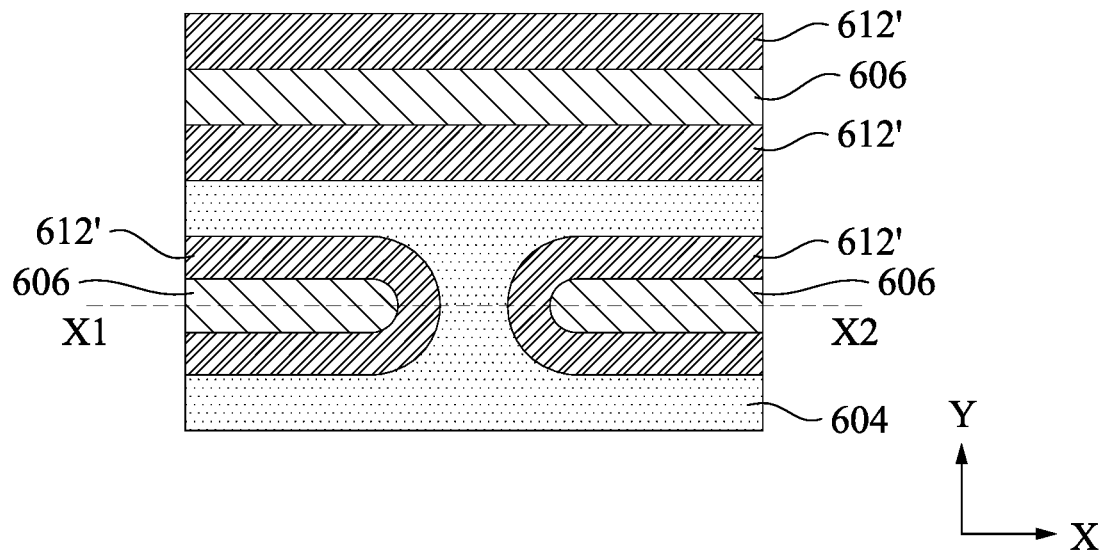
Figure 9B:
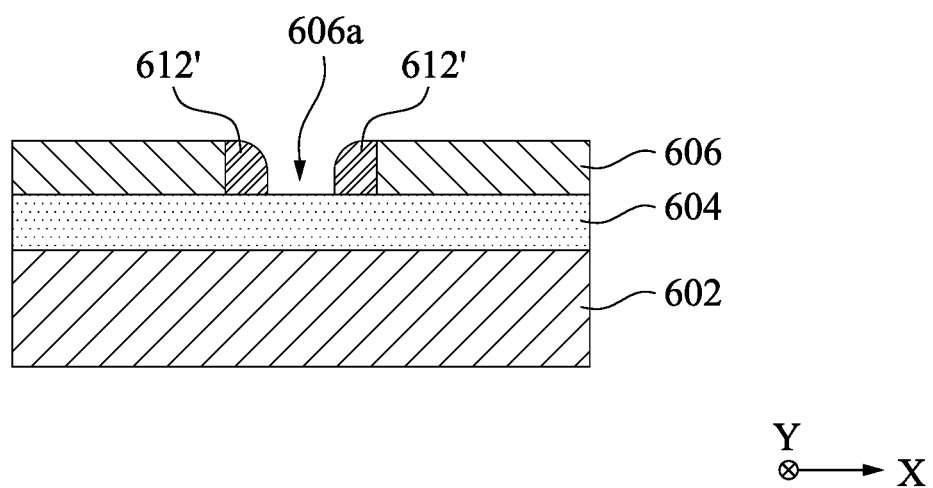

At step 410, the spacer layer 612 is etched. In one embodiment, the spacer layer 612 is etched using, for example, etch back processes, chemical-mechanical planarization (CMP) processes, and/or other suitable processes to remove an upper portion of the spacer layer 612 to form sidewall structures 612', as shown in FIGS. 9A-9B. The horizontal surfaces of the HM1 layer 606 and the HM2 layer 604 are exposed, while the sidewall structures 612' (i.e., the portions of the spacer layer 612 on the vertical sides of the opening 606a) remain.

Figure 10A:
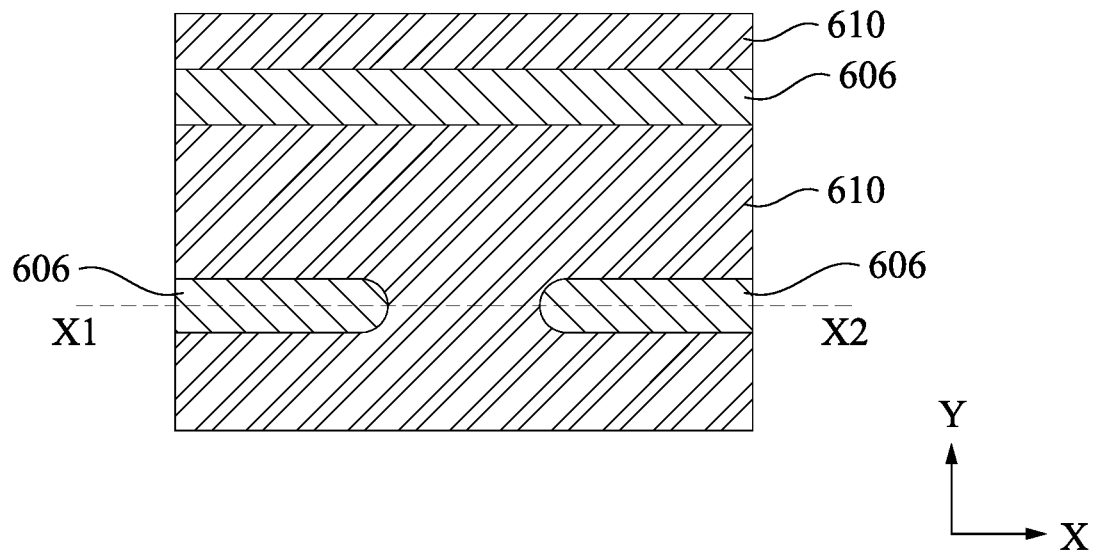
Figure 10B:
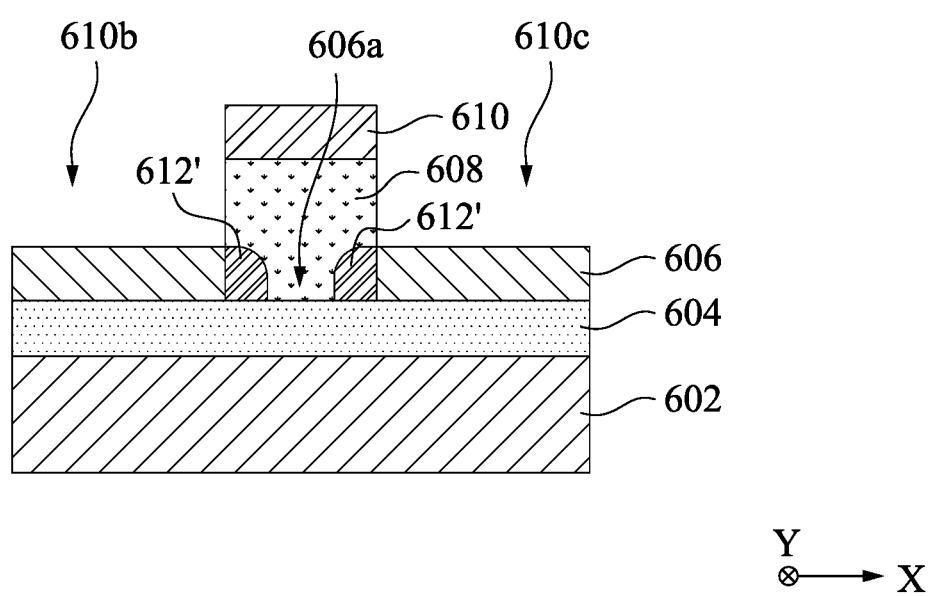

At step 412, another photolithography ("litho") is conducted using the mask pattern group B 504 of FIG. 5. Specifically, as shown in FIGS. 10A and 10B, another bottom layer 608 is applied on the semiconductor structure, and another photoresist layer 610 is applied on the bottom layer 608. After the photolithography at step 412, openings 610b and 610c in the photoresist layer 610 are patterned, as shown in FIGS. 10A and 10B. As a result, the portion of the bottom layer 608 corresponding to the openings 610b and 610c are exposed. The portion is etched afterwards at step 414.

At step 414, the remaining HM1 layer 606 is etched. As shown in FIGS. 10A and 10B, the portion of the bottom layer 608 and the portion of the HM1 layer 606 exposed through the openings 610b and 610c are removed in the etching process. After the remaining photoresist layer 610 and the remaining bottom layer 608 are removed, the HM2 layer 604 is exposed except the portion that is under the sidewall structures 612'.

At step 416, the HM2 layer 604 is etched. As mentioned above, since the HM2 layer 604 is exposed except the portion that is under the sidewall structures 612', only the portion that is under the sidewall structures 612' remains after step 416.

Figure 11A:
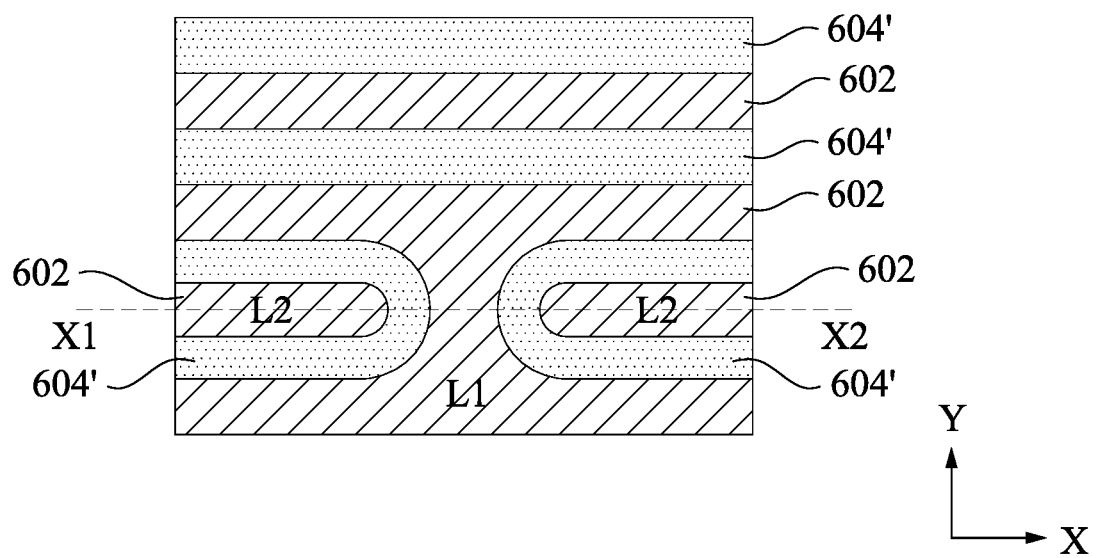
Figure 11B:
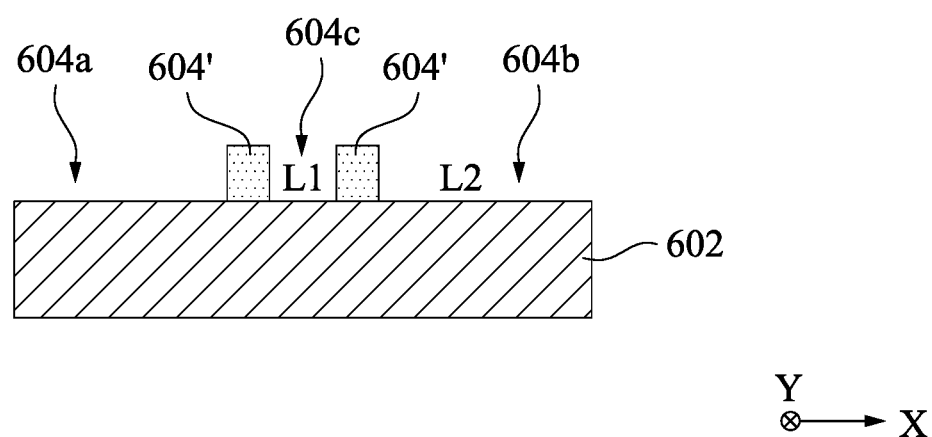

At step 418, the sidewall structures 612' are removed. As shown in FIGS. 11A and 11B, only the portion 604' (also called the separation structures 604') of the HM2 layer that was under the sidewall structures shown in FIGS. 10A and 10B remain.

Eventually at step 420, conductive (e.g., metal) patterns are deposited in areas defined by the separation structures 604'. As shown in FIGS. 11A and 11B, the openings 604a and 604b can be filled with conductive patterns to form, for example, the M0 patterns 114d and 114e of FIG. 2C; the opening 604c can be filled with a conductive pattern to form, for example, the M0 pattern 114c of FIG. 2C. The separation structures 604' automatically cut off the conductive patterns (i.e., deposited in the openings 604a and 604b) extending in the X direction. In other words, a metal cut is avoided for the mask pattern group B 504. The separation structures 604' also separate the conductive pattern (i.e., deposited in the opening 604c) extending in the Y direction from those conductive patterns extending in the X direction.

As such, an I-shaped conductive pattern, like the M0 patterns 114a, 114b, and 114c of FIG. 1, as well as the other conductive patterns, like the M0 patterns 114d and 114e of FIG. 1, are fabricated using the double-patterning LSLE process.

Figure 12:
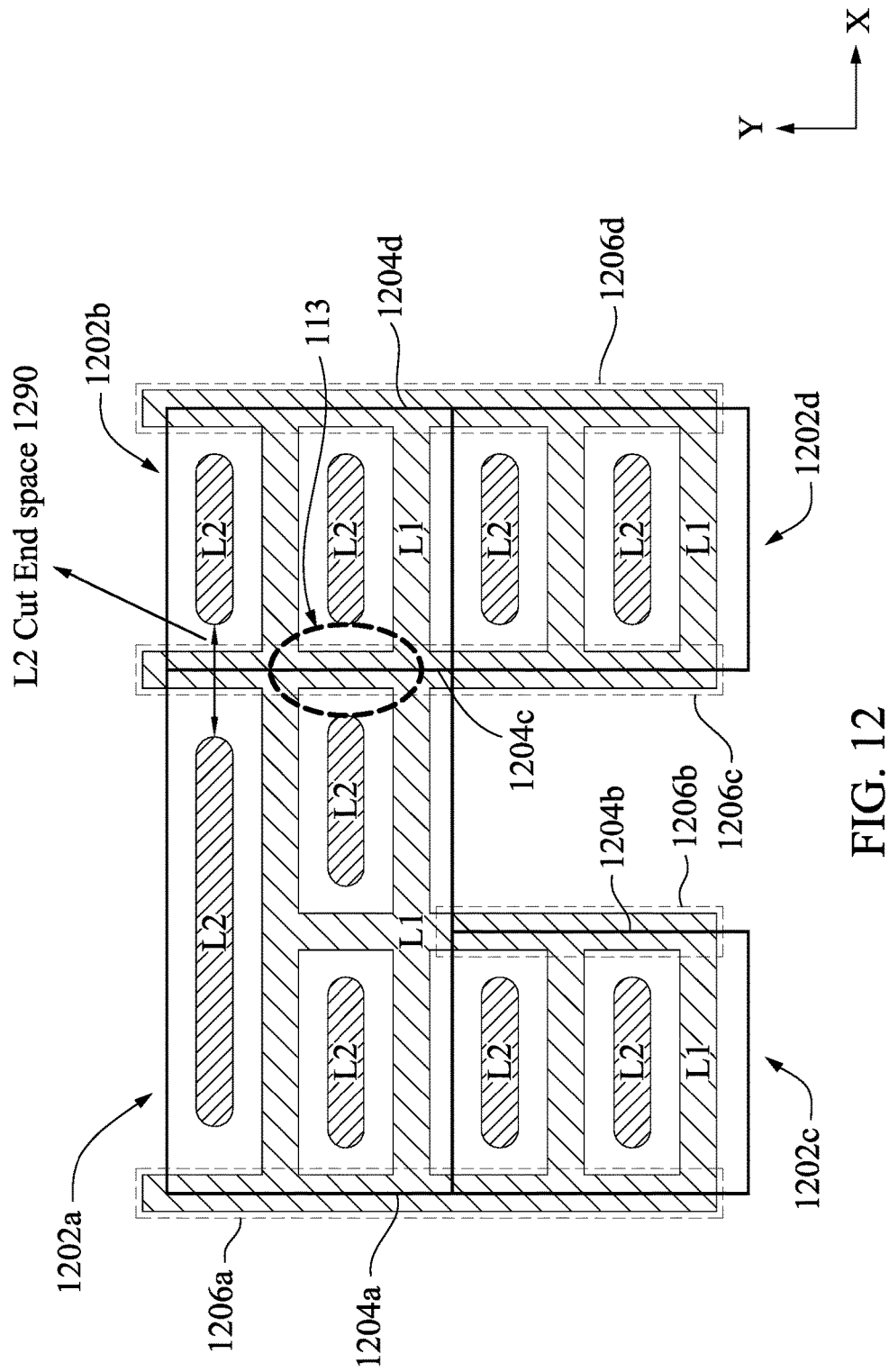
FIG. 12 is a diagram illustrating multiple cells and corresponding mask pattern groups in accordance with some embodiments.

FIG. 12 is a diagram illustrating multiple cells 1202 and corresponding mask pattern groups 502 and 504 in accordance with some embodiments. As shown in FIG. 12, multiple cells 1202a, 1202b, 1202c, and 1202d (collectively 1202) are arranged in a manner that neighboring cells share boundary lines 1204. For example, there are four boundary lines 1204a, 1204b, 1204c, and 1204d (collectively 1204) extending in the Y direction. Those four boundary lines 1204a, 1204b, 1204c, and 1204d overlap with patterns of the mask pattern group A 502. Since the L2 patterns are automatically cut off for an I-shaped M0 pattern 113, there is no need for an L2 metal cut mask to disconnect the cell 1202*a* and the cell 1202*b* at the boundary line 1204*c*. L1 metal cut masks 1206*a*, 1206*b*, 1206*c*, and 1206*d* are used to disconnect cells 1202 at the boundary lines 1204*a*, 1204*b*, 1204*c*, and 1204*d*, respectively. But L2 metal cut masks that are otherwise required are no longer needed due to the automatic cut off of L2 patterns mentioned above. In other words, one mask can be saved during the fabrication, therefore reducing fabrication costs. In some embodiments, the L2 cut end space 1290 is equal to the width (in the X direction) of a M0 pattern plus the overall width (in the X direction) of two separation structures. In a non-limiting example in FIG. 12, the L2 cut end space 1290 ranges from 26 nm to 36 nm.

Figure 13:
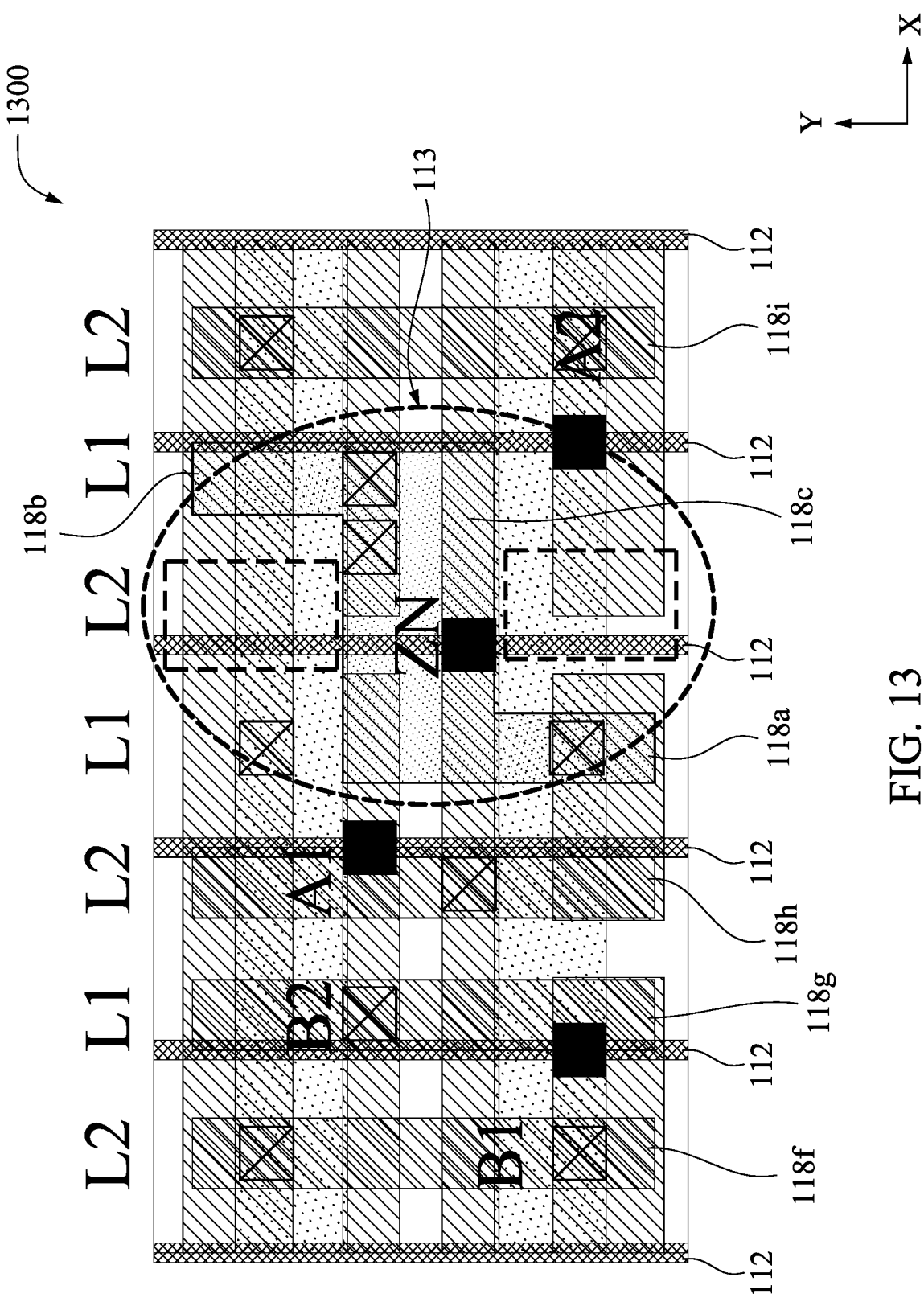
FIG. 13 is a diagram illustrating a layout that includes an I-shaped first metal (M1) pattern in accordance with some embodiments.

FIG. 13 is a diagram illustrating a layout 1300 that includes an I-shaped first metal (M1) pattern 113 in accordance with some embodiments. In general, the I-shaped pattern fabricated using the method 400 of FIG. 4 can be applied to other metal layers. In the example shown in FIG. 13, the I-shaped pattern fabricated using the method 400 of FIG. 4 is applied to the first metal (M1) layer. Gate structures 112 extend in the predefined direction (i.e., the Y direction), spaced with a poly pitch. The M1 patterns 118*f*, 118*g*, 118*h*, 118*a* 118*b* and 118*i* extend in the predefined direction (i.e., the Y direction), spaced with a minimum M1 pitch. In a non-limiting example shown in FIG. 13, the minimum M1 pitch is two thirds of the contacted poly pitch (CPP). Another M1 pattern 118*c* extends in the X direction, connecting the M1 patterns 118*a* and 118*b*. As such, the I-shaped M1 pattern 113 is formed. The M1 patterns 118*a* and 118*b* correspond to a mask pattern group (L1), whereas another mask pattern group (L2) is used to form M1 patterns that extend in the Y direction between the M1 patterns 118*a* and 118*b* and are cut off automatically (as shown by the boxes in dash line in FIG. 13). Specifically, the I-shaped M1 pattern 113 is fabricated using the method 400 of FIG. 4. In other words, the double-patterning LSLE process is applied to the M1 layer. The I-shaped M1 pattern 113 of FIG. 13 has the same benefits of those of the I-shaped M0 pattern 113 of FIGS. 1 and 2A, which will not be repeated for simplicity.

Figure 14:
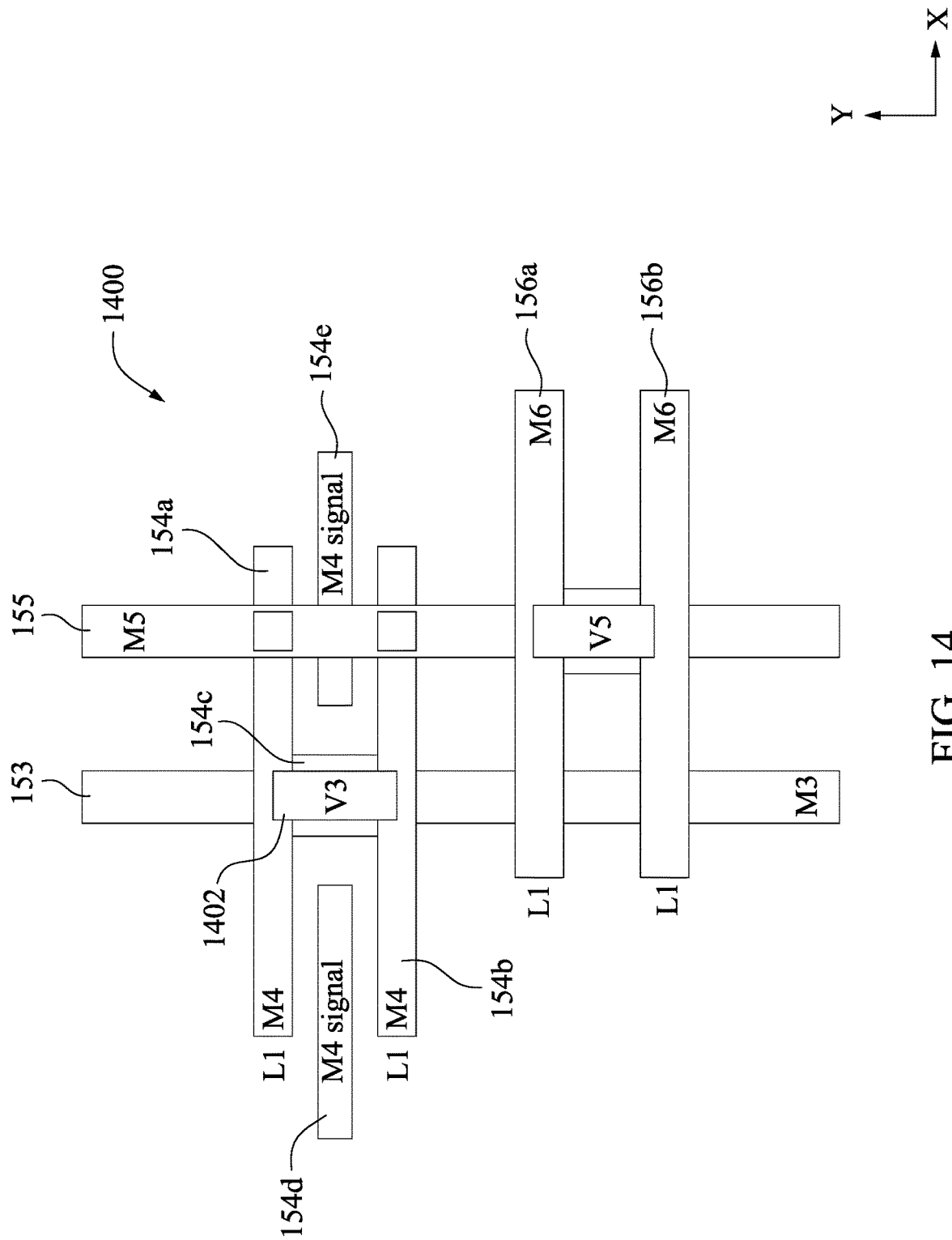
FIG. 14 is a diagram illustrating a power distribution network (PDN) layout that includes an I-shaped fourth metal (M4) pattern in accordance with some embodiments.

FIG. 14 is a diagram illustrating a power distribution network (PDN) layout 1400 that includes an I-shaped fourth metal (M4) pattern 154 in accordance with some embodiments. PDN is a network composed of patterns in multiple metal layers. PDN is used to provide appropriate distribution of operation voltages (e.g., VDD and VSS) to the IC. In the non-limiting example shown in FIG. 14, M4 patterns 154*a*, 154*b*, 154*d*, and 154*e* extend in the X direction; sixth metal (M6) patterns 156*a* and 156*b* extend in the X direction; third metal (M3) patterns 153 extends in the Y direction; fifth metal (M5) patterns 155 extends in the Y direction. Patterns in neighboring metal layers (M3 and M4) are connected through vias. In this example, the I-shaped pattern fabricated using the method 400 of FIG. 4 is applied to the M4 layer. Specifically, the M4 patterns 154*d* and 154*e* (used for signals rather than power distribution) are cut off automatically, whereas the M4 pattern 154*c* extends in the Y direction and connects the M4 patterns 154*a* and 154*b*. As such, the M4 pattern 154*c* can enlarge sizes of vias (e.g., via 1402 as shown in FIG. 14) landing thereon, therefore decreasing resistance for various applications. It should be noted that this technique can be applied to many metal layers (e.g., both M4 layer and M6 layer as shown in FIG. 14) in the PDN as needed.

In accordance with some disclosed embodiments, a semiconductor structure is provided. The semiconductor structure includes: a first gate structure extending in a first direction; a second gate structure extending in the first direction; a first base level metal interconnect (M0) pattern extending in a second direction perpendicular to the first direction; a second M0 pattern extending in the second direction; a third M0 pattern located between the first and second gate structures and extending in the first direction, a first end and a second end of the third M0 pattern connected to the first M0 pattern and the second M0 pattern, respectively; a fourth M0 pattern located between the first and second M0 patterns and extending in the second direction; and a fifth M0 pattern located between the first and second M0 patterns and extending in the second direction, the fifth M0 pattern aligned with the fourth M0 pattern in the second direction. The third M0 pattern is located between the fourth M0 pattern and the fifth M0 pattern in the second direction. A distance between the fourth M0 pattern and the first M0 pattern in the first direction is equal to a minimum M0 pattern pitch, and a distance between the fourth M0 pattern and the second M0 pattern is equal to the minimum M0 pattern pitch.

In accordance with some disclosed embodiments, a method of fabricating a semiconductor structure is provided. The method includes: providing a substrate, a first hard mask (HM1) layer, and a second hard mask (HM2) layer, the HM2 layer being on the substrate, the HM1 layer being on the HM2 layer; patterning a first mask pattern group, wherein the first mask pattern group comprises a first pattern extending in a first direction, a second pattern extending in the first direction, and a third pattern between the first pattern and the second pattern and extending in a second direction perpendicular to the first direction, a first end and a second end of the third pattern connected to the first pattern and the second pattern, respectively; etching the HM1 layer based on the first mask pattern group; depositing a spacer layer; etching the spacer layer to form sidewall structures; patterning a second mask pattern group, wherein the second mask pattern group comprises a fourth pattern located between the first and second patterns and a fifth pattern located between the first and second patterns, the fourth pattern and the fifth pattern being aligned and extending in the first direction, the third pattern located between the fourth pattern and the fifth pattern in the first direction; etching the HM1 layer based on the second mask pattern group; etching the HM2 layer, wherein the portion of the HM2 layer that is under the sidewall structures are protected by the sidewall structures.

In accordance with further disclosed embodiments, a semiconductor structure is provided. The semiconductor structure includes: a first conductive pattern extending in a first direction; a second conductive pattern extending in the first direction; a third conductive pattern extending in a second direction perpendicular to the first direction, a first end and a second end of the third conductive pattern connected to the first conductive pattern and the second conductive pattern, respectively; a fourth conductive pattern located between the first and second conductive patterns and extending in the first direction; and a fifth conductive pattern located between the first and second conductive patterns and extending in the first direction, the fifth conductive pattern aligned with the fourth conductive pattern in the first direction. The third conductive pattern is located between the fourth conductive pattern and the fifth conductive pattern in the first direction. A distance between the fourth conductive pattern and the first conductive pattern is equal to a minimum pattern pitch, and a distance between the fourth conductive pattern and the second conductive pattern is equal to the minimum pattern pitch.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first gate structure extending in a first direction;
   a second gate structure extending in the first direction;
   a first base level metal interconnect (M0) pattern extending in a second direction perpendicular to the first direction;
   a second M0 pattern extending in the second direction;
   a third M0 pattern located between the first and second gate structures and extending in the first direction, a first end and a second end of the third M0 pattern connected to the first M0 pattern and the second M0 pattern, respectively;
   a fourth M0 pattern located between the first and second M0 patterns and extending in the second direction;
   a fifth M0 pattern located between the first and second M0 patterns and extending in the second direction, the fifth M0 pattern aligned with the fourth M0 pattern in the second direction; and
   wherein the third M0 pattern is located between the fourth M0 pattern and the fifth M0 pattern in the second direction, and wherein a distance between the fourth M0 pattern and the first M0 pattern in the first direction is equal to a minimum M0 pattern pitch, and a distance between the fourth M0 pattern and the second M0 pattern is equal to the minimum M0 pattern pitch.

2. The semiconductor structure of claim 1, further comprising:
   a first separation structure located between the fourth M0 pattern and the third M0 pattern in the second direction; and
   a second separation structure located between the fifth M0 pattern and the third M0 pattern in the second direction.

3. The semiconductor structure of claim 2, wherein the first separation structure and the second separation structure are electrically non-conductive.

4. The semiconductor structure of claim 1, wherein a proximate end of the fourth M0 pattern has radiused corners, and a proximate end of the fifth M0 pattern has round corners.

5. The semiconductor structure of claim 4, wherein a difference between a maximum distance between the fourth M0 pattern and the fifth M0 pattern and a minimum distance between the fourth M0 pattern and the fifth M0 pattern is larger than a half of a width of the fourth M0 pattern.

6. The semiconductor structure of claim 1, wherein the first M0 pattern, the second M0 pattern, and the third M0 pattern correspond to a first mask pattern group, and the fourth M0 pattern and the fifth M0 pattern correspond to a second mask pattern group.

7. The semiconductor structure of claim 1, wherein the first M0 pattern and the second M0 pattern have a same width.

8. The semiconductor structure of claim 1, wherein the first M0 pattern and the second M0 pattern have different widths.

9. The semiconductor structure of claim 1, further comprising:
   a first gate vertical interconnect access (via) connecting the first gate structure and the fourth M0 pattern; and
   a second gate via connecting the second gate structure and the fifth M0 pattern.

10. The semiconductor structure of claim 1, wherein the first M0 pattern is cut off over the first gate structure, and the second M0 pattern is cut off over the second gate structure.

11. A semiconductor structure, comprising:
    a first conductive pattern extending in a first direction;
    a second conductive pattern extending in the first direction;
    a third conductive pattern extending in a second direction perpendicular to the first direction, a first end and a second end of the third conductive pattern connected to the first conductive pattern and the second conductive pattern, respectively;
    a fourth conductive pattern located between the first and second conductive patterns and extending in the first direction;
    a fifth conductive pattern located between the first and second conductive patterns and extending in the first direction, the fifth conductive pattern aligned with the fourth conductive pattern in the first direction; and
    wherein the third conductive pattern is located between the fourth conductive pattern and the fifth conductive pattern in the first direction, and wherein a distance between the fourth conductive pattern and the first conductive pattern is equal to a minimum pattern pitch, and a distance between the fourth conductive pattern and the second conductive pattern is equal to the minimum pattern pitch.

12. The semiconductor structure of claim 11, further comprising:
    a first electrically non-conductive separation structure located between the fourth conductive pattern and the third conductive pattern in the second direction; and
    a second electrically non-conductive separation structure located between the fifth conductive pattern and the third conductive pattern in the second direction.

13. The semiconductor structure of claim 11, wherein the first conductive pattern, the second conductive pattern, and the third conductive pattern correspond to a first mask pattern group, and the fourth conductive pattern and the fifth conductive pattern correspond to a second mask pattern group.

14. A method of fabricating a semiconductor structure, comprising:
    forming a first gate structure extending in a first direction;
    forming a second gate structure extending in the first direction;
    forming a first base level metal interconnect (M0) pattern extending in a second direction perpendicular to the first direction;
    forming a second M0 pattern extending in the second direction;
    forming a third M0 pattern located between the first and second gate structures and extending in the first direction, a first end and a second end of the third M0 pattern connected to the first M0 pattern and the second M0 pattern, respectively;

forming a fourth M0 pattern located between the first and second M0 patterns and extending in the second direction;

forming a fifth M0 pattern located between the first and second M0 patterns and extending in the second direction, the fifth M0 pattern aligned with the fourth M0 pattern in the second direction;

such that the third M0 pattern is located between the fourth M0 pattern and the fifth M0 pattern in the second direction, and wherein a distance between the fourth M0 pattern and the first M0 pattern in the first direction is equal to a minimum M0 pattern pitch, and a distance between the fourth M0 pattern and the second M0 pattern is equal to the minimum M0 pattern pitch.

15. The method of claim 14, further comprising:

forming a first separation structure located between the fourth M0 pattern and the third M0 pattern in the second direction; and forming a second separation structure located between the fifth M0 pattern and the third M0 pattern in the second direction.

16. The method of claim 15, wherein the first separation structure and the second separation structure are electrically non-conductive.

17. The method of claim 14, wherein forming the fourth M0 pattern includes forming radiused corners at a proximate end of the fourth M0 pattern, and wherein forming the fifth M0 pattern includes forming round corners at a proximate end of the fifth M0 pattern.

18. The method of claim 17, wherein a difference between a maximum distance between the fourth M0 pattern and the fifth M0 pattern and a minimum distance between the fourth M0 pattern and the fifth M0 pattern is larger than a half of a width of the fourth M0 pattern.

19. The method of claim 14, wherein the first M0 pattern, the second M0 pattern, and the third M0 pattern correspond to a first mask pattern group, and the fourth M0 pattern and the fifth M0 pattern correspond to a second mask pattern group.

20. The method of claim 14, wherein the first M0 pattern and the second M0 pattern have a same width.

* * * * *